(12) United States Patent
Ritter et al.

(10) Patent No.: US 6,840,308 B2
(45) Date of Patent: Jan. 11, 2005

(54) HEAT SINK ASSEMBLY

(75) Inventors: Allen M. Ritter, Roanoke, VA (US);
Hugh David Black, Salem, VA (US)

(73) Assignee: General Electric Co., Schenectady, NY (US)

( * ) Notice: Subject to any disclaimer, the term of this patent is extended or adjusted under 35 U.S.C. 154(b) by 0 days.

(21) Appl. No.: 10/063,985

(22) Filed: May 31, 2002

(65) Prior Publication Data

US 2003/0221813 A1 Dec. 4, 2003

(51) Int. Cl.⁷ ................................................. H05K 7/20
(52) U.S. Cl. ..................... 165/80.4; 165/80.2; 165/170
(58) Field of Search .............................. 165/170, 80.2, 165/80.4, 185; 361/699, 704, 710

(56) References Cited

U.S. PATENT DOCUMENTS

| | | | |
|---|---|---|---|
| 3,453,579 | A | 7/1969 | Cinquin |
| 3,671,911 | A | 6/1972 | Kozacka |
| 3,678,431 | A | 7/1972 | Franklin |
| 3,693,128 | A | 9/1972 | Jacobs |
| 3,713,065 | A | 1/1973 | Brichant |
| 3,715,698 | A | 2/1973 | Blewett |
| 3,793,603 | A | 2/1974 | Fontaine |

(List continued on next page.)

FOREIGN PATENT DOCUMENTS

| | | |
|---|---|---|
| DE | 2029083 | 12/1970 |
| FR | 91187 | 8/1968 |
| FR | 2183852 | 12/1973 |
| FR | 2420202 | 10/1979 |
| GB | 1221387 | 2/1971 |

OTHER PUBLICATIONS

"Fluid–Cooled DBC Scbstrates," by J. Schulz–Harder, K. Exel, and A. Meyer.

"Direct Bond Copper Substrates," from Thermalloy.

PCT International Search Report dated Oct. 10, 2002, for application No. PCT/US02/12420, filed Apr. 19, 2002.

U.S. patent application 09/683,496, filed Jan. 9, 2002.

*Primary Examiner*—Allen J. Flanigan
(74) *Attorney, Agent, or Firm*—Hunton & Williams LLP

(57) ABSTRACT

The invention provides a heat sink assembly, and a method of making and using a heat sink assembly, for cooling a device using circulating fluid. The heat sink assembly comprises a housing including at least one housing inlet passage and at least one housing outlet passage. A first cavity is disposed in the housing and a plurality of first cavity column members are disposed in the first cavity. The first cavity column members are arranged in a plurality of rows such that first cavity column members in a row are staggered with respect to first cavity column members in an adjacent row. The heat sink assembly further includes a second cavity disposed in the housing and a plurality of second cavity column members disposed in the second cavity. The second cavity column members are arranged in a plurality of rows, which are also staggered.

36 Claims, 7 Drawing Sheets

U.S. PATENT DOCUMENTS

| | | | |
|---|---|---|---|
| 4,041,434 A | 8/1977 | Jacobs, Jr. et al. | |
| 4,170,000 A | 10/1979 | Trayer | |
| 4,189,695 A | 2/1980 | Hirahara | |
| 4,375,630 A | 3/1983 | Gaia | |
| 4,475,152 A | 10/1984 | Ikegame et al. | |
| 4,546,621 A * | 10/1985 | Kline et al. | 62/51.1 |
| 4,559,580 A * | 12/1985 | Lutfy | 361/689 |
| 4,765,397 A * | 8/1988 | Chrysler et al. | 165/104.33 |
| 5,005,640 A * | 4/1991 | Lapinski et al. | 165/170 |
| 5,144,531 A | 9/1992 | Go et al. | |
| 5,205,353 A | 4/1993 | Willemsen et al. | |
| 5,666,269 A * | 9/1997 | Romero et al. | 361/699 |
| 5,841,634 A | 11/1998 | Visser | |
| 5,918,469 A | 7/1999 | Cardella | |
| 5,978,220 A | 11/1999 | Frey et al. | |
| 5,987,893 A | 11/1999 | Schulz-Harder et al. | |
| 5,988,266 A * | 11/1999 | Smith et al. | 165/78 |
| 6,014,312 A | 1/2000 | Schulz-Harder et al. | |
| 6,018,459 A | 1/2000 | Carlson et al. | |
| 6,131,644 A | 10/2000 | Kohara et al. | |
| 6,131,650 A | 10/2000 | North et al. | |
| 6,137,169 A | 10/2000 | Pace | |
| 6,397,932 B1 * | 6/2002 | Calaman et al. | 165/80.4 |
| 6,563,709 B2 * | 5/2003 | Negishi et al. | 361/699 |

* cited by examiner

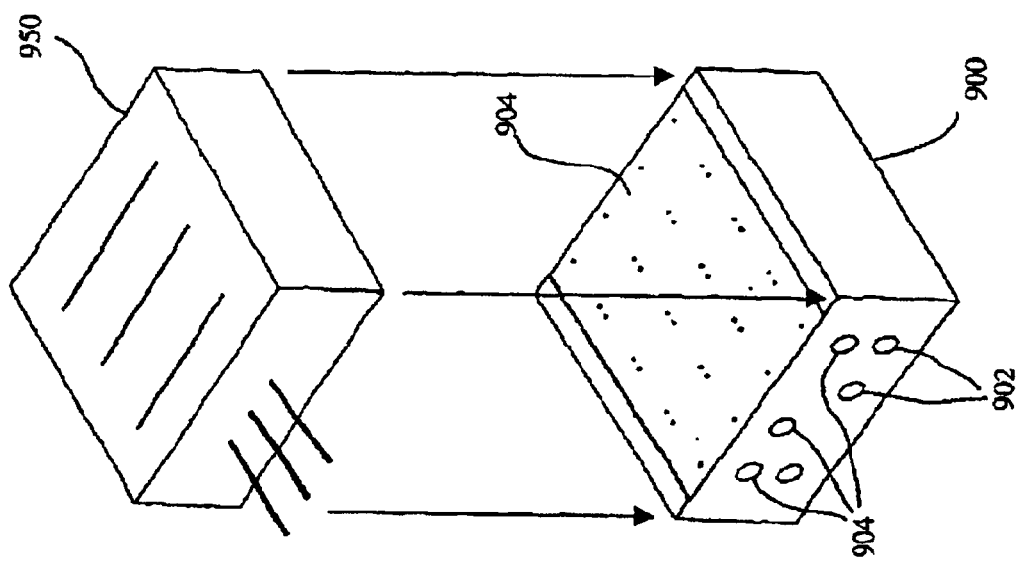

HEAT SINK ASSEMBLY

BACKGROUND OF THE INVENTION

The present invention relates generally to a heat sink, and more particularly, to a heat sink arrangement for removing heat from electrical components.

As technology advances, computer components and other electrical components continue to decrease in size. Additionally, more and more components are disposed in a continually decreasing area. Further, the various electrical components are typically disposed within a closed housing or compartment, or alternatively, a portion of a housing. These factors are coupled with the typical situation that electrical components, such as electrical components in computers, generate heat. This creates a problem related to the dispersion of the generated heat.

That is, as components are made smaller and packed more tightly into an area, it becomes more and more difficult to effectively disperse heat from those components. If heat is not dispersed effectively from the components, this can result in the components operating at an increased temperature. However, as should be appreciated, such operation at an increased temperature often leads to the degradation of the electrical component, especially over a period of time.

Accordingly, it is known to provide heat sinks to cool electrical components. However, in a manner similar to the electrical components themselves, there is a desire to decrease the size of the heat sinks. This decrease in size of a heat sink is balanced with a concern that the decreased size heat sink will not be able to sufficiently cool an electrical component.

A traditional heat sink, for example, includes a core structure upon which fins are mounted. The core structure is suitably thermally coupled with the electrical component that the heat sink is intended to cool. As a result, the thermal energy passes from the electrical component to the core structure. In turn, the thermal energy passes from the core structure to the fins of the heat sink. The thermal energy is dissipated from the fins utilizing a suitable medium passing by the fins, such as air or liquid, i.e., a fluid. However, this traditional structure often cannot perform cooling given the space constraints. There are other heat sink arrangements. However, these other arrangements also suffer from space limitation drawbacks, as well as other shortcomings.

Accordingly, it is desired to provide a heat sink for effectively cooling electrical components given the limited space constraints of emerging technology. The present invention addresses this need as well as others.

SUMMARY OF THE INVENTION

In accordance with one aspect, the invention provides a heat sink assembly for cooling a device using circulating fluid, the heat sink assembly comprising a housing including at least one housing inlet passage and at least one housing outlet passage; a first cavity disposed in the housing, the first cavity including a first cavity top surface and including a first cavity bottom surface opposed to the first cavity top surface, the first cavity further including a first cavity inlet side adjacent a first cavity inlet and a first cavity outlet side adjacent a first cavity outlet, the first cavity inlet in fluid communication with the at least one housing inlet passage; a plurality of first cavity column members disposed in the first cavity, the first cavity column members connected to and extending from the first cavity bottom surface to proximate the first cavity top surface, the first cavity column members arranged in a plurality of rows such that first cavity column members in a row are staggered with respect to first cavity column members in an adjacent row; a second cavity disposed in the housing, the second cavity including a second cavity top surface and including a second cavity bottom surface opposed to the second cavity top surface, the second cavity further including a second cavity inlet side adjacent to a second cavity inlet and a second cavity outlet side adjacent to a second cavity outlet, the first cavity outlet in fluid communication with the second cavity inlet through an interim connecting fluid path, and the second cavity outlet in fluid communication with the at least one housing outlet passage; and a plurality of second cavity column members disposed in the second cavity, the second cavity column members connected to and extending from the second cavity bottom surface to proximate the second cavity top surface, the second cavity column members arranged in a plurality of rows such that second cavity column members in a row are staggered with respect to second cavity column members in an adjacent row.

In accordance with a further aspect of the invention, a heat sink assembly is provided for cooling a device using circulating fluid, the heat sink assembly comprising a housing including at least one housing inlet passage and at least one housing outlet passage; a first cavity disposed in the housing, the first cavity including a first cavity top surface and including a first cavity bottom surface opposed to the first cavity top surface, the first cavity further including a first cavity inlet side adjacent a first cavity inlet and a first cavity outlet side adjacent a first cavity outlet, the first cavity inlet in fluid communication with the at least one housing inlet passage; a plurality of first cavity column members disposed in the first cavity, the first cavity column members connected to and extending from the first cavity bottom surface to proximate the first cavity top surface, the first cavity column members arranged in a plurality of rows such that first cavity column members in a row are staggered with respect to first cavity column members in an adjacent row, the first cavity column members being connected to the first cavity top surface; a second cavity disposed in the housing, the second cavity including a second cavity top surface and including a second cavity bottom surface opposed to the second cavity top surface, the second cavity further including a second cavity inlet side adjacent to a second cavity inlet and a second cavity outlet side adjacent to a second cavity outlet, the first cavity outlet in fluid communication with the second cavity inlet through an interim connecting fluid path, and the second cavity outlet in fluid communication with the at least one housing outlet passage; and a plurality of second cavity column members disposed in the second cavity, the second cavity column members connected to and extending from the second cavity bottom surface to proximate the second cavity top surface, the second cavity column members arranged in a plurality of rows such that second cavity column members in a row are staggered with respect to second cavity column members in an adjacent row, the second cavity column members connected to the second cavity top surface; wherein the housing includes a housing inlet portion that includes the at least one housing inlet passage, and wherein the first cavity and the plurality of first cavity column members each being disposed in the housing inlet portion; and a housing outlet portion that includes the at least one housing outlet passage, and wherein the second cavity and the plurality of second cavity column members each being disposed in the housing outlet portion. The housing inlet portion and the housing outlet portion are matingly engageable, the housing inlet portion including a groove extending around at least a portion of an upper surface of the housing inlet portion. The housing outlet portion including a lower surface forming a plateau having a periphery with a peripheral edge defining the periphery, the peripheral edge of the plateau matingly engageable with the groove of the housing inlet portion; and an inlet conduit connected to the inlet passage of the housing; and an outlet conduit connected to the outlet passage of the housing. Further, the first cavity inlet side directly opposes the first cavity outlet side such that fluid passing from the first cavity inlet to the first cavity outlet passes by the first cavity column members, and the first cavity inlet disperses the flow of fluid along a length of the first cavity inlet side, and the first cavity outlet provides for outlet of the flow of fluid along a length of the first cavity outlet side; and the heat sink assembly further includes an electrical component that is cooled, the housing engaged with the electrical component.

BRIEF DESCRIPTION OF THE DRAWINGS

The present invention can be more fully understood by reading the following detailed description together with the accompanying drawings, in which like reference indicators are used to designate like elements, and in which:

FIG. 7 is an exploded view of a heat sink assembly and an electrical component in accordance with a further embodiment of the invention.

DETAILED DESCRIPTION OF THE INVENTION

Figure 1:
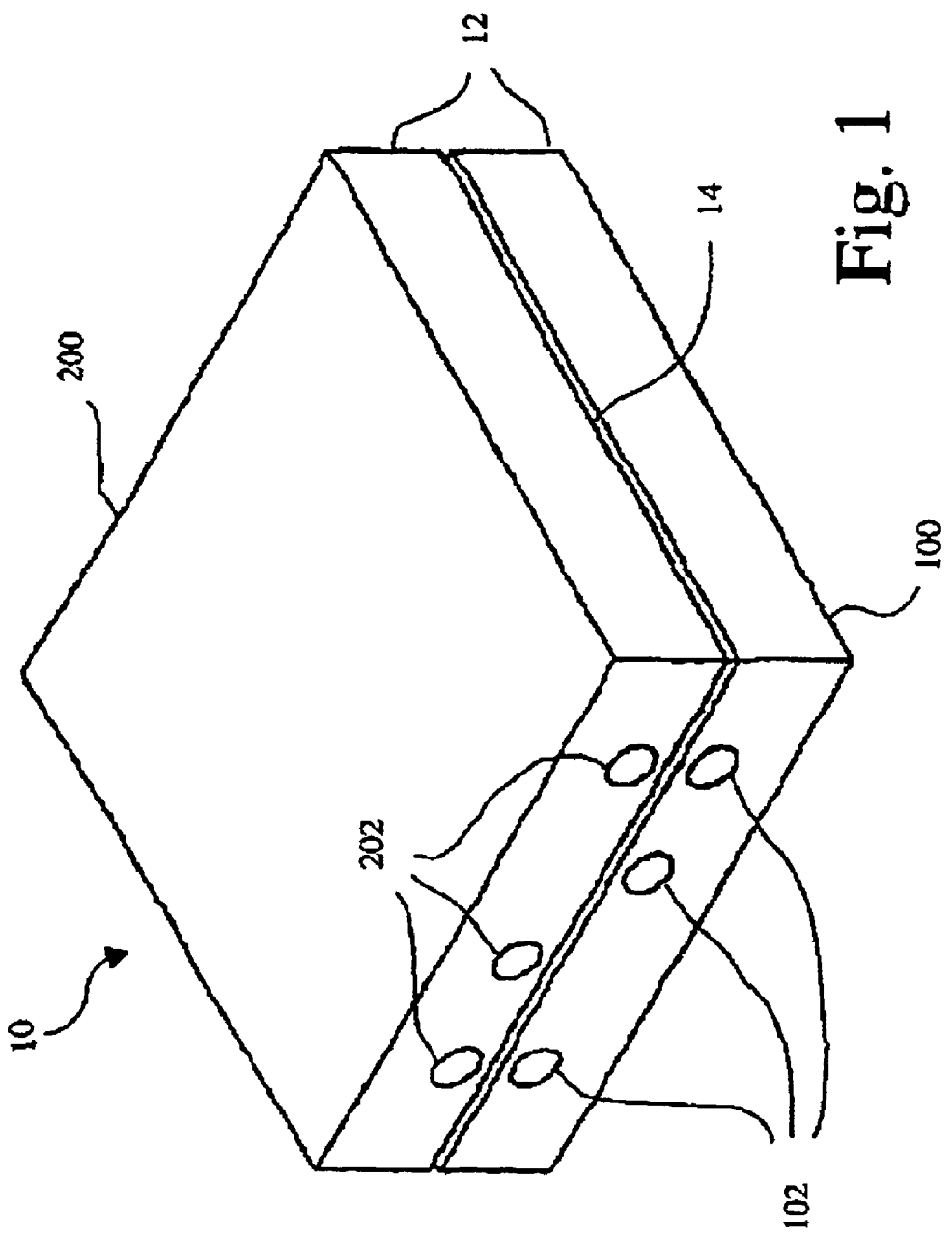
FIG. 1 is a perspective view of a heat sink assembly according to one embodiment of the invention.

Hereinafter, aspects of the heat sink and methods of making and using the heat sink will be described in accordance with various embodiments of the invention. As used herein, any term in the singular may be interpreted to be in the plural, and alternatively, any term in the plural may be interpreted to be in the singular.

The foregoing description of known products, methods, or apparatus and their attendant disadvantages is in no way intended to limit the scope of the present invention, or to imply that the present invention does not include some or all of the various elements of the products, methods, and apparatus in one form or another. Indeed, various embodiments of the invention may be capable of overcoming some of the disadvantages noted herein, while still retaining some or all of the various elements of the products, methods, and apparatus in one form or another.

In accordance with exemplary embodiments of the present invention, a heat sink is provided by which heat can be effectively dispersed from electrical components, for example. Further, the heat sink of the invention can be utilized in the tight space limitations that are often present.

Yet further, the heat sink of the invention can be quickly and inexpensively manufactured. The heat sink of the invention may be utilized in an environment that provides fluid, such as water or high-density gas, for example, to pass through the heat sink in order to carry heat away from an electrical component.

The invention provides a simple to construct, high interference heat carrying pathway that minimizes straight line travel of the fluid passing through the heat sink and forces the fluid to have different fluid filaments in contact with the hot surfaces. As a result, turbulent flow is created, and laminate flow is minimized, thus reducing insulating layers that typically surround lubricated surfaces in laminate flow situations. Further, the arrangement of the heat sink of the invention minimizes the number of thermal interfaces and fluid leakage potential. As used herein "fluid" means any medium that can be passed through the heat sink assembly of the invention in order to take heat away including, but not limited to, water, water with additives, air, high-density gas or any other gas or liquid.

In accordance with embodiments of the heat sink of the invention, turbulence producing obstructions are disposed within cavities. The fluid is then passed through the cavities. The optimization of the placement and dimensions of the turbulence producing obstructions provide minimum thermal impedance through the various portions of the heat sink.

An exemplary application of the present invention is used in combination with a motor control for discharging current. The heat sink of the invention may be suitably connected to the motor control such that heat from the power semiconductor mounting structure, of the motor control, is discharged to the heat sink. The heat is subsequently carried away by the fluid, which passes through the heat sink.

FIG. 1 is a perspective view showing a heat sink assembly 10 in accordance with one embodiment of the invention. The heat sink assembly 10 includes a housing 12. Also, the heat sink assembly 10 may include any pipes, conduits or other fluid passing structures designed to provide fluid to the housing 12 and remove fluid from the housing 12. The housing 12 includes a housing inlet portion 100 and housing outlet portion 200. Fluid passes into the housing inlet portion 100 through housing inlet passages 102. The fluid is then circulated in the housing inlet portion 100, as is described further below.

Subsequent to circulation in the housing inlet portion 100, the fluid passes to the housing outlet portion 200. Subsequent to circulation within the housing outlet portion 200, the fluid exits the housing 12 through housing outlet passages 202. It should be appreciated that the number, shape, and orientation of the housing inlet passages 102 and housing outlet passages 202 may vary as is desired. The housing outlet portion 200 and housing inlet portion 100 may be integrally formed using a casting procedure, for example. Alternatively, the housing inlet portion 100 and housing outlet portion 200 may be joined at a fluid-proof junction 14 as shown in FIG. 1, in accordance with one embodiment of the invention.

Figure 2:
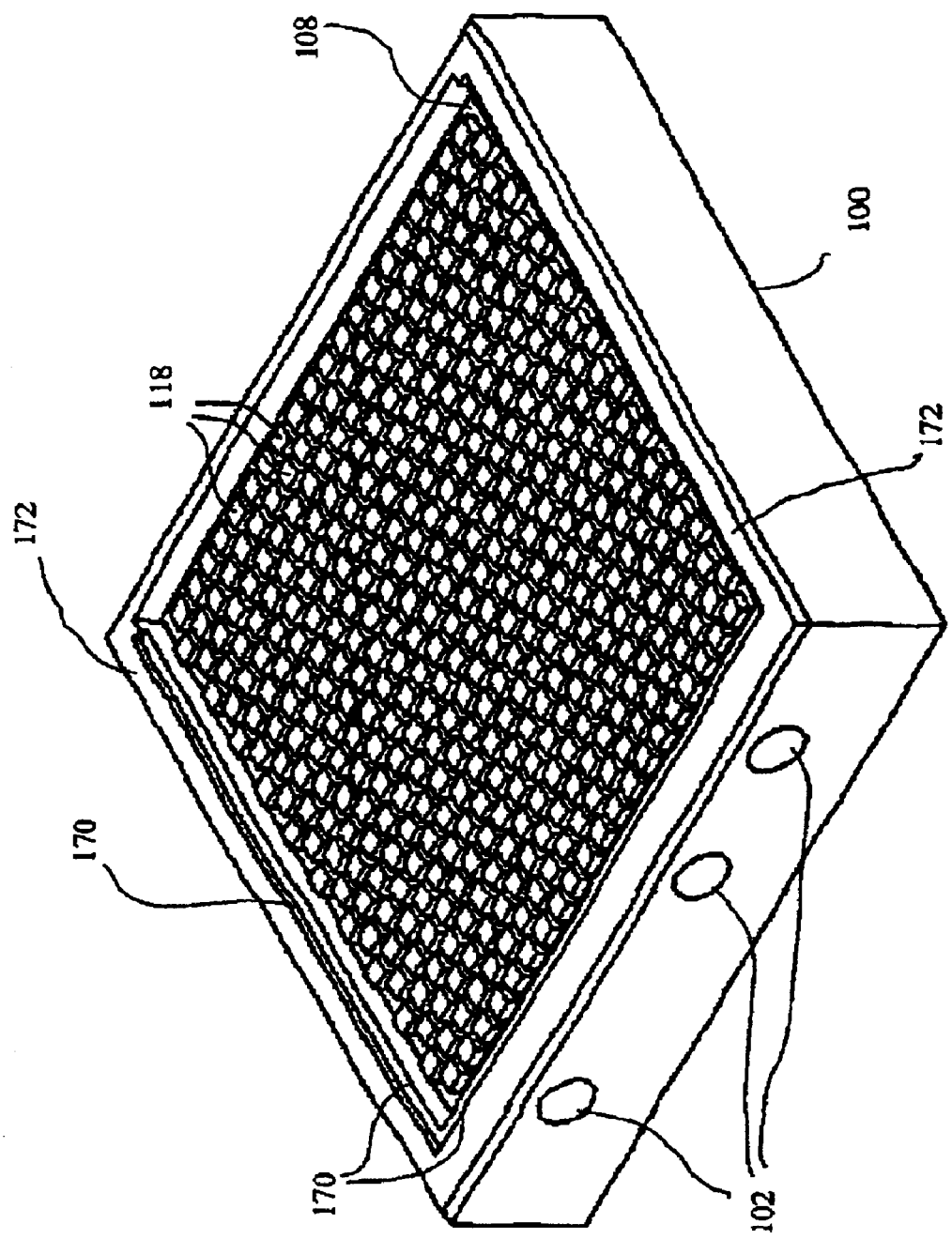
FIG. 2 is a perspective view of the housing inlet portion according to one embodiment of the invention.
Figure 3:
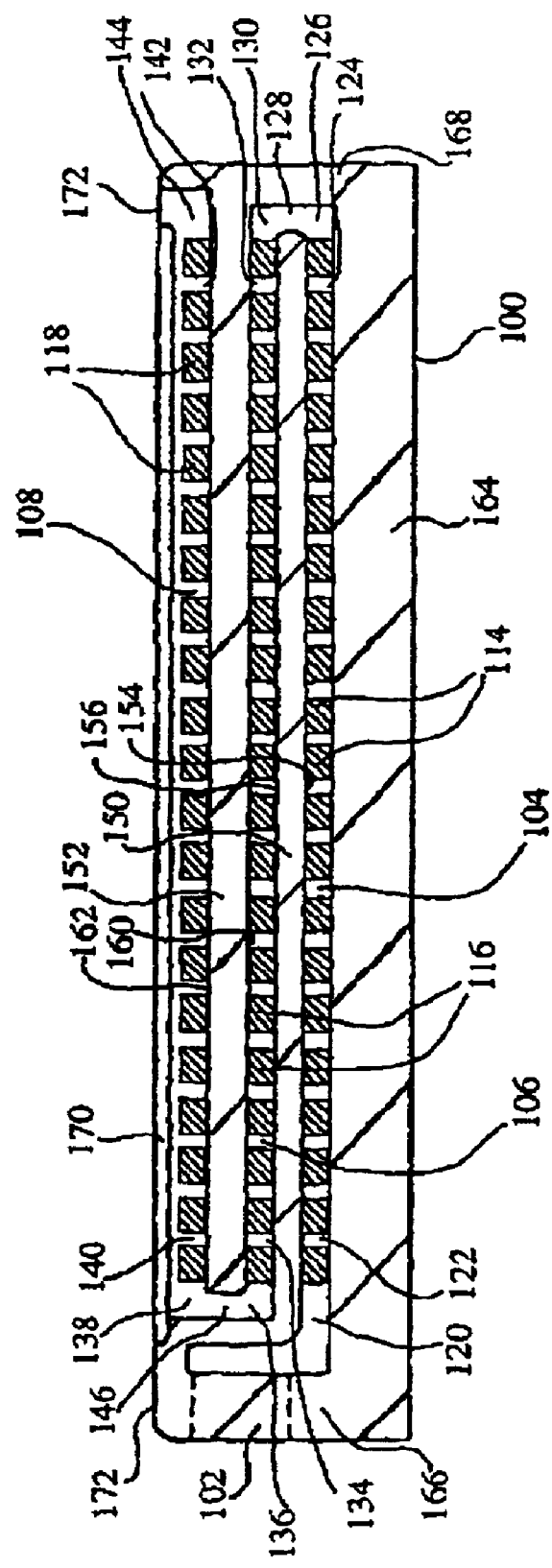
FIG. 3 is a cross-sectional view of the housing inlet portion of FIG. 2 across the cavities according to one embodiment of the invention.

FIG. 2 is a perspective view of the housing inlet portion 100, shown separated from the housing outlet portion 200. Further, FIG. 3 is a cross-sectional view of the housing inlet portion 100 as shown in FIG. 2, showing the various cavities disposed in the housing inlet portion 100. Specifically, FIG. 3 shows a first cavity 104, a third cavity 106, and a fourth cavity 108. It should be noted that, as characterized herein, a "second cavity" is disposed in the housing outlet portion 200, as is described below.

The housing inlet portion 100 further includes a plurality of first cavity column members 114 disposed in the first cavity 104. A plurality of third cavity column members 116 are disposed in the third cavity 106. Further, a plurality of fourth cavity column members 118 are disposed in the fourth cavity 108.

In accordance with the embodiment of the invention as shown in FIG. 2 and FIG. 3, fluid initially passes into the housing inlet portion 100 through the housing inlet passages 102. The fluid is channeled into and through the first cavity 104. As the fluid passes through the first cavity 104, the fluid passes by the first cavity column members 114 in a turbulent manner. More specifically, the housing inlet passage 102 is in fluid communication with a first cavity inlet 120, as shown in FIG. 3. The first cavity inlet 120 provides the fluid to a first cavity inlet side 122, i.e., a portion of the first cavity 104. The fluid passes from the first cavity inlet side 122 to a first cavity outlet side 124. Then, the fluid passes to a first cavity outlet 126.

Subsequent to the fluid passing through the first cavity outlet 126, the fluid passes into a first elongated aperture 128. The first elongated aperture 128 extends along one side of the housing inlet portion 100, as is described in further detail below. The first elongated aperture 128 communicates the fluid from the first cavity outlet 126 to a third cavity inlet 130. A third cavity inlet side 132 is adjacent to the third cavity inlet 130 such that fluid passes from the third cavity inlet 130 into the third cavity inlet side 132.

In a manner similar to the first cavity 104, the third cavity 106 includes the third cavity inlet side 132 and a third cavity outlet side 134. Accordingly, fluid passes from the third cavity inlet side 132 to the third cavity outlet side 134. As the fluid passes through the third cavity 106, the fluid is circulated around and through, in a turbulent manner, the third cavity column members 116.

Subsequent to passing through the third cavity outlet side 134, the fluid passes into a third cavity outlet 136. The fluid is then communicated to a fourth cavity inlet 138 through a second elongated aperture 146. In turn, the fluid is communicated to a fourth cavity inlet side 140 of the fourth cavity 108. The fluid passes through the fourth cavity 108 from the fourth cavity inlet side 140 to a fourth cavity outlet side 142. The fluid then passes into a fourth cavity outlet 144.

As shown in FIG. 3, the third cavity outlet 136 is in fluid communication with the fourth cavity inlet 138 through a second elongated aperture 146. The second elongated aperture 146 extends along one side of the housing inlet portion 100. In the embodiment of the invention shown in FIG. 3, the second elongated aperture 146 extends along a side of the housing inlet portion 100 opposite to the first elongated aperture 128. Accordingly, the first elongated aperture 128 and the second elongated aperture 146 extend in parallel fashion to each other. Further, as shown in FIG. 3, the second elongated aperture 146 is disposed proximate to, but separated from, the housing inlet passage 102 and the first cavity inlet 120.

As shown in FIG. 3, the housing inlet portion 100 further includes a first separation wall 150 and a second separation wall 152. The first separation wall includes opposing sides 154 and 156. The side 154 of the first separation wall 150 defines the first cavity 104 top surface. Further, the side 156 of the first separation wall 150 defines a bottom surface of the third cavity 106.

The second separation wall 152 includes opposing sides 160 and 162. The side 160 of the second separation wall 152 forms a top surface of the third cavity 106. Further, the side 162 of the second separation wall 152 defines a bottom surface of the fourth cavity 108.

In further explanation, the housing inlet portion 100, shown in FIG. 3, includes a bottom plate portion 164, as well as a housing inlet side portion 166 and a side portion 168. The housing inlet passage 102 passes through the housing inlet side portion 166. The housing inlet side portion 166 is disposed opposite the side portion 168. Accordingly, the bottom plate portion 164 connects the housing inlet side portion 166 and the side portion 168 as shown in FIG. 3. It should be appreciated that each of the bottom plate portion 164, the housing inlet side portion 166 and the side portion 168 may be integrally formed with each other. Further, the first separation wall 150 may be integrally formed with the housing inlet side portion 166, using an aluminum casting process, for example. Further, the second separation wall 152 may be integrally formed with the side portion 168. Such integral formation of the portions of the housing inlet portion 100 provide for ease of manufacture in accordance with some embodiments of the invention.

It should be appreciated that the various embodiments of the invention are described herein using spatial descriptors such as "bottom," and "top." However, it should be appreciated that such spatial descriptors are utilized herein for purposes of explanation. Accordingly, it should be appreciated that what is herein characterized as a top portion may alternatively be characterized as a bottom portion, for example. Further, what is herein characterized as bottom portion, may also be characterized as a top portion, for example. Further aspects of FIG. 2 and FIG. 3 are described below.

Figure 4:
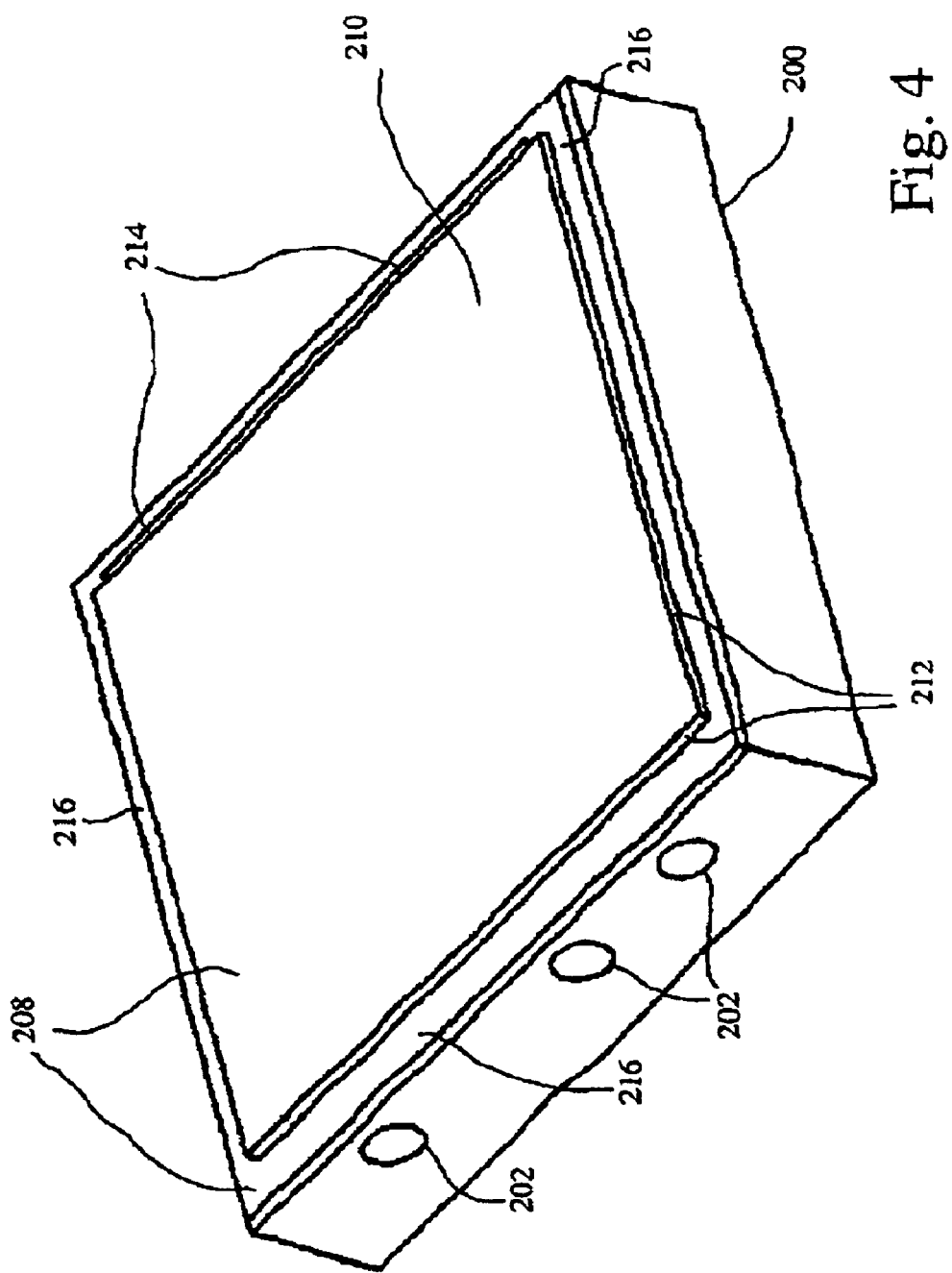
FIG. 4 is a perspective view of a housing outlet portion according to one embodiment of the invention.

FIG. 4 is a perspective view of the housing outlet portion 200 of FIG. 1, shown upside down relative to FIG. 1. As described above, the housing outlet portion 200 includes housing outlet passages 202. With further reference to FIGS. 2 and 3 showing the housing inlet portion 100 and FIG. 4 showing the housing outlet portion 200, it can be seen that the two housing portions (100, 200) are matingly engageable with each other. Specifically, as shown in FIG. 2, the housing inlet portion 100 includes a groove 170 extending around at least a portion of an upper surface 172 of the housing inlet portion 100. As shown in FIG. 2, the groove 170 extends along three of four sides of the housing inlet portion 100.

As shown in FIG. 4, the housing outlet portion 200 includes a lower surface 208 which mates with the groove 170 of the housing inlet portion 100. Specifically, as shown in FIG. 4, the housing outlet portion 200 may be rotated over so as to be positioned upon the housing inlet portion 100, as shown in FIG. 2. The lower surface 208 of the housing outlet portion 200 forms a plateau 210. The plateau 210 is defined by a peripheral edge 212 that defines the periphery of the plateau 210. The peripheral edge 212 also defines a shelf 216 that extends around the plateau 210. The peripheral edge 212 of the plateau 210 is matingly engageable with the groove 170 of the housing inlet portion 100. Further, as should be appreciated, the plateau 210, once the housing outlet portion 200 is positioned upon the housing inlet portion 100, forms a top surface of the fourth cavity 108.

The housing outlet portion 200 also includes a third elongated aperture 214, shown in FIG. 4. As described above, fluid passes through the fourth cavity 108 from the fourth cavity inlet side 140 to the fourth cavity outlet side 142. The fluid then passes through the fourth cavity outlet 144. After passing through the fourth cavity outlet 144, the fluid exits from the housing inlet portion 100 and passes into the housing outlet portion 200 through the third elongated aperture 214. It should be appreciated that the housing outlet portion 200 may include cavities and cavity column members in a manner similar to the housing inlet portion 100. Further, the internal structure of the housing outlet portion 200 essentially corresponds with the upper portion of the housing 300, described below and shown in FIG. 5 in accordance with one embodiment of the invention. Accordingly, further details regarding the internal structure of the housing outlet portion 200 will not be described in further detail.

It should be appreciated that the heat sink of the invention provides a beneficial flow situation as fluid passes through the heat sink. Specifically, the flow through the heat sink of the invention provides non-laminate or turbulent flow, as opposed to laminate flow. The generation of such a turbulent flow removes an insulating layer that would otherwise surround the cooling surfaces, i.e., the cavity column members, for example. That is, laminate flow demands an insulating layer around the lubricated surfaces that exist in the flow path. This is the reason why laminate flow is not desirable, since the insulating layer results in such lubricated surfaces being subject to a higher thermal impedance. Accordingly, the heat sink of the invention provides turbulence in the fluid passing through the heat sink, which in turn results in a low thermal impedance from the hot fluid to the cooling surfaces. That is, the turbulent flow does not simply provide vortexes in the fluid, but further results in the breakdown of the insulting layer around the lubricated surfaces, i.e., around the cavity column members, for example.

Figure 5:
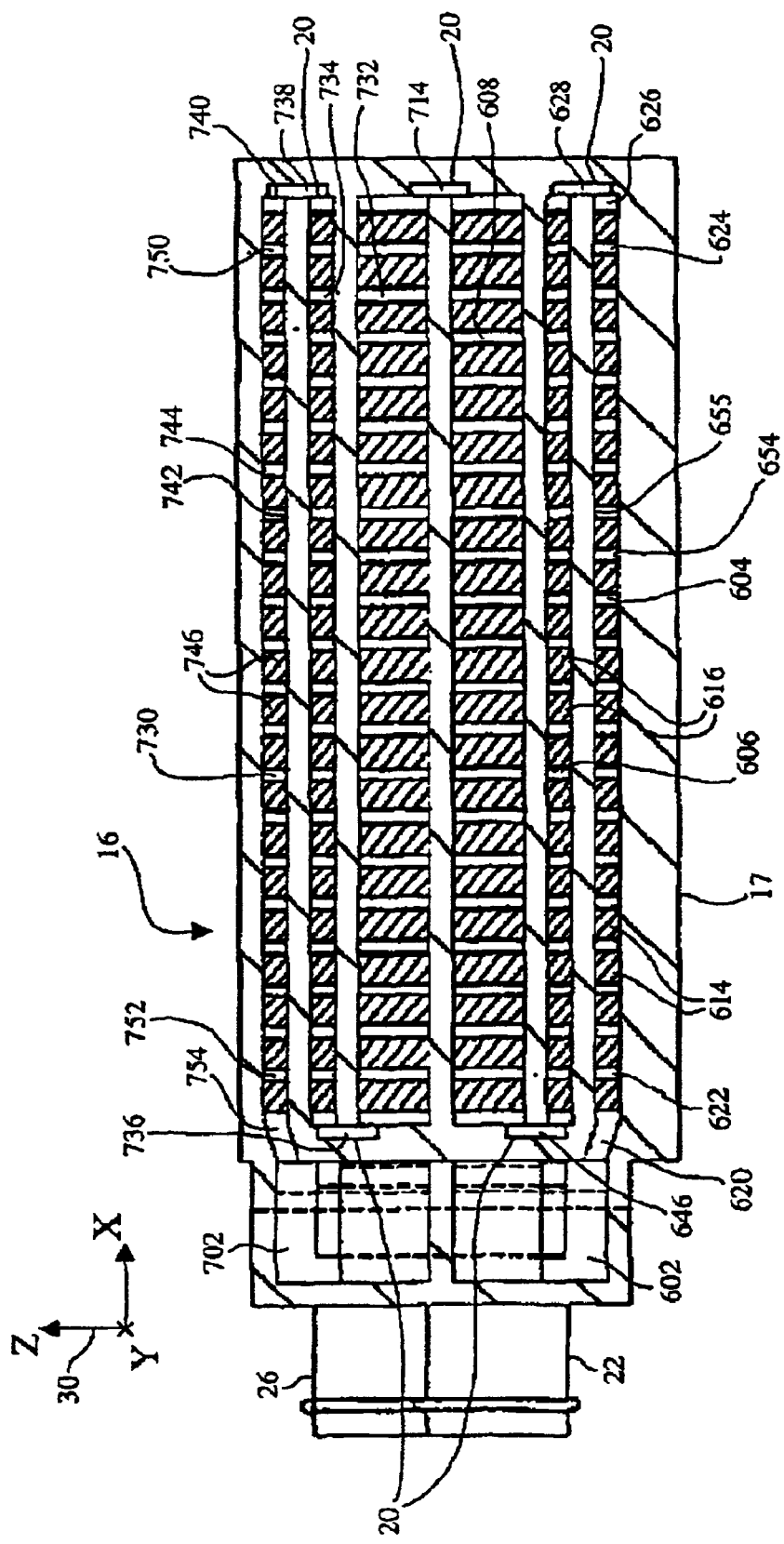
FIG. 5 is a cross-sectional view of a heat sink assembly in accordance with a further embodiment of the invention.

FIG. 5 is a cross-sectional view showing a heat sink assembly 16 in accordance with a further embodiment of the invention. The heat sink assembly 16 includes a housing 17, as well as an input portal 22 and an output portal 26. The input portal 22 provides fluid to the housing 17. The output portal 22 outputs fluid from the housing 17. The housing 17 includes a housing inlet passage 602 and a housing outlet passage 702. Any suitable arrangement of passages may be used to input and output the fluid from the cavities of the housing 17. Fluid passes from the input portal 22 into the housing inlet passage 602.

A first cavity 604 is disposed in the housing 17. The first cavity 604 includes a first cavity top surface 655 and a first cavity bottom surface 654. The first cavity top surface 655 is opposed to the first cavity bottom surface 654. Further, the first cavity 604 includes a first cavity inlet side 622 and a first cavity outlet side 624. Fluid passes into the first cavity 604 from the housing inlet passage 602 through a first cavity inlet 620. Accordingly, the first cavity inlet 620 is in fluid communication with at least one housing inlet passage 602.

As shown in FIG. 5, a plurality of first cavity column members 614 are disposed in the first cavity 604. The first cavity column members are connected to and extend from the first cavity bottom surface 654 to proximate the first cavity top surface 655. That is, in accordance with one embodiment of the invention, the first cavity column members 614 approach, but do not contact the first cavity top surface 655. In accordance with an alternative embodiment, the first cavity column members 614 are in physical contact with the first cavity top surface 655.

Figure 6:
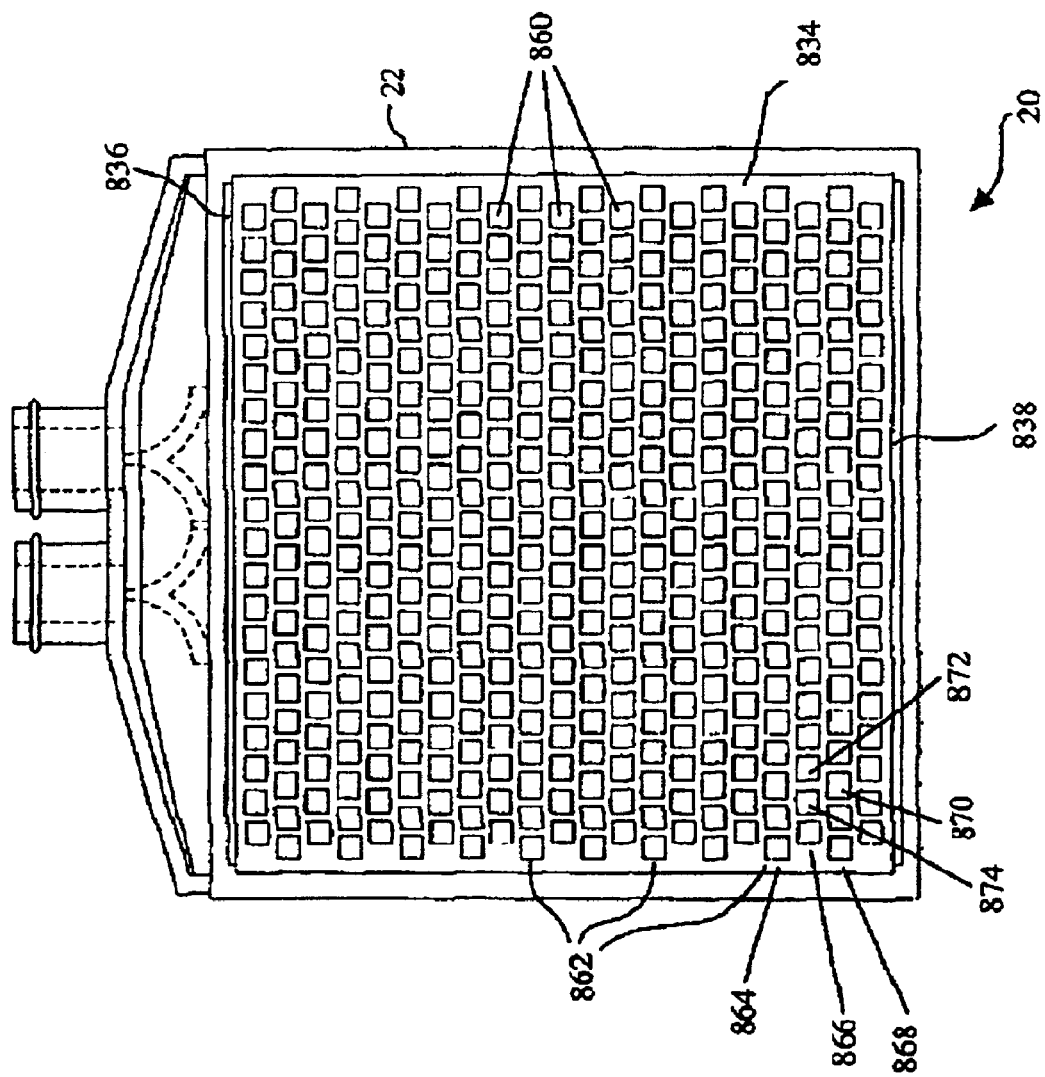
FIG. 6 is a top view of a heat sink assembly according to one embodiment of the invention.

The first cavity column members 614 are arranged in a plurality of rows such that the first cavity column members 614 are staggered with respect to first cavity column member 614 in an adjacent row, i.e., such as shown in FIG. 6, for example. Further aspects of the relative positioning of the cavity column members within the respective cavities will be described in further detail below. As the fluid passes from the first cavity inlet side 622 to the first cavity outlet side 624, the fluid passes through and around the plurality of first cavity column members 614 in a turbulent manner. As a result, heat is transferred from the fluid to the first cavity column members 614 in an effective manner. After the fluid passes through the first cavity outlet side 624, the fluid passes through a first cavity outlet 626 and into a first elongated aperture 628. The first elongated aperture 628 extends along the side of the housing 17 in a manner similar to the first elongated aperture 128 shown in FIG. 3.

After passing through the first elongated aperture 628, the fluid then passes into a third cavity 606. A plurality of third cavity column members 616 are disposed in the third cavity 606. The third cavity column members 616 further remove heat from the circulating fluid.

In accordance with one aspect of the invention, FIG. 5 shows that the cavity column members may be different sizes and/or different dimensions. It should be appreciated that there may be a cost factor associated with the various attributes of the heat sink assembly of the invention. This cost factor might be effected by attributes such as pressure drop of the cooling fluid, weight of the fluid and volume of the fluid as well as the material and other manufacture aspects of the heat sink assembly, such as size of the components. In a given operating situation, these various parameters, as well as others, may be optimized for most cost efficient operation, if so desired. Other factors that factor into such an optimization of the heat sink assembly of the invention include the heat sensitivity of the parts of the heat sink assembly and the temperature accumulation of the fluid, for example.

With further reference to FIG. 5, after passing through the third cavity 606, the fluid is then routed through a number of additional cavities. It should be appreciated that the particular number of cavities, and cavity column members disposed in those cavities, may vary as is desired. Illustratively, as shown in FIG. 5, the fluid passes from the third cavity 606 to a fourth cavity 608 through a second elongated aperture 646. After passing through the fourth cavity 608, the fluid passes from the fourth cavity 608 to a fifth cavity 732 through a third elongated aperture 714. The fluid then passes through the fifth cavity 732 being circulated through and between the cavity column members disposed in the fifth cavity 732. The fluid then passes from the fifth cavity 732 to a sixth cavity 734 through a fourth elongated aperture 736. Subsequent to being circulated through the sixth cavity 734 and the cavity column members disposed therein, the fluid is circulated through a fifth elongated aperture 738 and into the second cavity 730 via a second cavity inlet 740.

Accordingly, the first cavity outlet 626 is in fluid communication with the second cavity inlet 740 through what may be characterized as an interim connecting fluid path 20. That is, the interim connecting fluid path 20 includes, collectively, the passages or apertures that serve to connect the various cavities. Accordingly, in the embodiment shown in FIG. 5, the interim connecting fluid path 20 includes the first elongated aperture 628, the second elongated aperture 646, the third elongated aperture 714, the fourth elongated aperture 736, and the fifth elongated aperture 738.

Fluid passes from the fifth elongated aperture 738 through the second cavity inlet 740 into the second cavity 730. For purposes of explanation, further details of the second cavity 730 will hereinafter be described. The second cavity 730 is defined in part by a second cavity bottom surface 742 and a second cavity top surface 744. A plurality of second cavity column members 746 are disposed in the second cavity 730. The second cavity column members are connected to and extend from the second cavity bottom surface 742 to proximate the second cavity top surface 744, i.e., in a manner similar to the first cavity column members. More specifically, in accordance with one embodiment of the invention, the second cavity column member 746 may approach, but not be in physical contact with, the second cavity top surface 744. In accordance with an alternative embodiment, the second cavity column member 746 may be in physical contact and connected to the second cavity top surface 744. The second cavity column members 746 are arranged in a plurality of rows such that second cavity column members 746 in a particular row are staggered in respect to second cavity column member 746 in an adjacent row. Further aspects of the arrangement of the cavity column members are described below.

The fluid is circulated through the second cavity 730 from a second cavity inlet side 750 to a second cavity outlet side 752. That is, the fluid is circulated through and around the second cavity column members 746 in the second cavity 730. Subsequent to passing through the second cavity outlet side 752, the fluid flows through a second cavity outlet 754 into the housing outlet passage 702. After the fluid passes the housing outlet passage 702, the fluid passes into and through an output portal 26.

It should be appreciated that the shape and size of the cavity column members, as used in the various embodiments of the invention, may be varied. To provide further explanation, FIG. 5 shows a coordinate system 30. The coordinate system 30 includes a Z-axis and an X-axis. Further, a Y-axis extends normal to each of the Z-axis and the X-axis, i.e., the Y-axis extends into the paper as shown in FIG. 5. Accordingly, for example, the first cavity bottom surface 654 extends in the X-Y plane. With exemplary reference to the first cavity column number 614, each of the first cavity column members 614 extend along the Z-axis or dimension from the first cavity bottom surface 654 to the first cavity top surface 655. As a result of such orientation, the first cavity column members 614 possess a cross-sectional area disposed in the X-Y plane. Illustratively, each of the column members in the housing 17 may possess a generally square cross-section in the X-Y plane. Accordingly, the X-dimension of each of the first cavity column member 614 is substantially equal to a Y-dimension of each of the first cavity column member 614. However, the invention is not limited to such square cross-sectional shape of the cavity column members. Rather, the cross-sectional shape of the cavity column members may be any suitable shape, as is desired. For example, each of the cavity column members 614 may be shaped so as to define a circle in the X-Y plane. Alternatively, the cavity column members may be shaped so as to define an elliptical in the X-Y plane. Accordingly, the shape of the various cavity column members disposed in the housing of the invention may be varied as is desired.

FIG. 6 is a top sectional view of a heat sink assembly 20, which includes a housing 22, in accordance with a further embodiment of the invention. More specifically, the embodiment of the heat sink as shown in FIG. 6 shows an arrangement of cavity column members within a cavity. For example, the arrangement of cavity column members shown in FIG. 6 might be utilized in the heat sink shown in FIG. 3 or FIG. 5.

As shown in FIG. 6, a plurality of cavity column members 860 are disposed in the cavity 834. An elongated aperture 836 communicates fluid into the cavity 834. Further, fluid exits from the cavity 834 through an elongated aperture 838. As shown in FIG. 6, the cavity column members 860 are arranged in rows 862. Illustratively, the rows 862 include row 864, row 866 and row 868. The cavity column members 860 in a particular row are staggered with respect to cavity column members 860 in an adjacent row. Accordingly, the cavity column members in the row 864 are staggered with respect to the cavity column members in the row 866. As used herein, the term "staggered" means that a particular cavity column member overlaps two cavity column members in an adjacent row. To explain, the cavity column member 870, in the row 868, overlaps the two cavity column members (872, 874) in the row 866.

As shown in FIG. 6, the cavity 834 is substantially square shaped. However, it should be appreciated that any of a variety of shapes may be utilized, in accordance with the various embodiments of the invention, so long as the shape provides for the fluid to enter the cavity, pass through and be circulated around the cavity column members, and subsequently exit the particular cavity. Further, the number and size of the cavity column members disposed in each cavity may be varied as desired, i.e., based on cost considerations as described above, for example. Further, the invention is not limited to the elongated apertures (836, 838) extending only along a particular side. For example, an elongated aperture, such as apertures (836, 838) may be disposed along one side of a cavity, as well as along a portion or all of an adjacent side or sides of the cavity.

FIG. 7 is a perspective view showing a housing 900 in accordance with a further embodiment of the invention. As shown in FIG. 7, fluid is communicated into the housing 900 through the housing inlet passages 902. The internal arrangement of the housing 900 is the same as that discussed above with respect to FIGS. 1-6. Accordingly, further details of the internal arrangement of the housing 900 will not be described. Subsequent to circulation through the housing 900, the fluid exists the housing 900 through the housing outlet passages 904.

FIG. 7 also illustrates a further aspect of the invention. Specifically, the housing 900 includes a conductive plate 904. An electrical component 950 may be attached to the conductive plate 904 so as to allow conduction of thermal energy from the electrical component 950 to the housing 900 through the connective plate 904. In turn, the heat passes from the conductive plate 904 into the various cavity column members, which are disposed in the various cavities, in the housing 900.

The heat sink assembly of the invention may be constructed using a variety of techniques. For example, the heat sink of the invention may be constructed of aluminum using a casting procedure using one or multiple pours to create the heat sink. The use of one casting procedure provides reduced cost and more efficient manufacture of the heat sinks. However, it should be appreciated that other materials may be used, as well as other construction techniques.

FIG. 7 illustrates the feature that the housing in accordance with the various embodiments of the invention may be constructed of different materials as is desired. For example, the portion of the housing 900 that is connected to an electrical component 950 may be constructed of material that possesses a lower thermal impedance than the materials utilized to construct the other portions of the housing 900. Various considerations may be taken into account in construction of the housing 900 including the magnitude of the transfer of thermal energy from the electrical component as well as cost considerations, for example.

As shown in FIG. 7, the housing 900 includes three housing inlet passages 902 and three housing outlet passages 904. However, it should be appreciated that the number of housing inlet passages and the number of housing outlet passages may be varied as desired. For example, the number of passages (902, 904) may be increased if a particularly large fluid flow is required. Further, the particular arrangement of the passages (902, 904) may be varied. For example, in the embodiment shown in FIG. 7, two housing inlet passages 902 may be positioned closer to one another, as compared to a third housing inlet passage 902.

It should be appreciated that the housing inlet passages may be positioned to provide a uniform pressure along a manifold area of the heat exchanger, i.e., along the portion or side of the heat exchanger at which the fluid enters. This is of particular note at a high flow rate, as compared to a low flow rate. Accordingly, it may be desired to effect a gentle pressure gradient at the intended flow rates and avoid turbulence in the manifold area.

With further reference to FIG. 5, it should be appreciated that the cavity column members may be aligned with each other. For example, as shown in FIG. 5, the first cavity column member 614 may be in line with the third cavity column members 616, as well as the second cavity column members 746. Further, the cavity column members in each of the other cavities may also be aligned.

It will be readily understood by those persons skilled in the art that the present invention is susceptible to broad utility and application. Many embodiments and adaptations of the present invention other than those herein described, as well as many variations, modifications and equivalent arrangements, will be apparent from or reasonably suggested by the present invention and foregoing description thereof, without departing from the substance or scope of the invention.

Accordingly, while the present invention has been described here in detail in relation to its exemplary embodiments, it is to be understood that this disclosure is only illustrative and exemplary of the present invention and is made to provide an enabling disclosure of the invention. Accordingly, the foregoing disclosure is not intended to be construed or to limit the present invention or otherwise to exclude any other such embodiments, adaptations, variations, modifications and equivalent arrangements.

What is claimed is:

1. A heat sink assembly for cooling a device using circulating fluid, the heat sink assembly comprising:
   a housing including at least one housing inlet passage and at least one housing outlet passage;
   a first cavity disposed in the housing, the first cavity including a first cavity top surface and including a first cavity bottom surface opposed to the first cavity top surface, the first cavity further including a first cavity inlet side adjacent a first cavity inlet and a first cavity outlet side adjacent a first cavity outlet, the first cavity inlet in fluid communication with the at least one housing inlet passage;
   a plurality of first cavity column members disposed in the first cavity, the first cavity column members connected to and extending from the first cavity bottom surface to proximate the first cavity top surface, the first cavity column members arranged in a plurality of rows such that first cavity column members in a row are staggered with respect to first cavity column members in an adjacent row;
   a second cavity disposed in the housing, the second cavity including a second cavity top surface and including a second cavity bottom surface opposed to the second cavity top surface, the second cavity further including a second cavity inlet side adjacent to a second cavity inlet and a second cavity outlet side adjacent to a second cavity outlet, the first cavity outlet in fluid communication with the second cavity inlet through an interim connecting fluid path, and the second cavity outlet in fluid communication with the at least one housing outlet passage; and
   a plurality of second cavity column member disposed in the second cavity, the second cavity column members connected to and extending from the second cavity bottom surface to proximate the second cavity top surface, the second cavity column members arranged in a plurality of rows such that second cavity column members in a row are staggered with respect to second cavity column members in an adjacent row;
   wherein the first cavity inlet side directly opposes the first cavity outlet side such that fluid passing from the first cavity inlet to the first cavity outlet passes by the first cavity column members, and
   the first cavity inlet dispenses the flow of fluid along a length of the first cavity inlet side; and
   the first cavity outlet provides for outlet of the flow of fluid along a length of the first cavity outlet side; and
   wherein;
   the first cavity inlet includes a plurality of inlet conduits along the length of the first cavity inlet side; and
   the first cavity outlet is an elongated aperture extending along a length of the first cavity outlet side.

2. The heat sink assembly according to claim 1, wherein the interim connecting fluid path is an interim connecting passage that directly connects the first cavity outlet to the second cavity inlet.

3. The heat sink assembly according to claim 2, wherein the interim connecting passage is defined in part by a portion of the housing.

4. The heat sink assembly according to claim 1, wherein the first cavity column members are aligned with the second cavity column members, each of the first cavity column member and the second cavity column members being cylindrical in shape.

5. The heat sink assembly portion according to claim 1, further including:
   an inlet conduit connected to the inlet passage of the housing; and
   an outlet conduit connected to the outlet passage of the housing.

6. The heat sink assembly portion according to claim 1, wherein the heat sink assembly further includes the device that is cooled, the housing engaged with the device.

7. The heat sink assembly portion according to claim 6, wherein the device is an electrical component.

8. The heat sink assembly portion according to claim 1, wherein
   the first cavity column members contact, and are connected to, the first cavity top surface; and
   the second cavity column members contact, and are connected to, the second cavity top surface.

9. The heat sink assembly portion according to claim 1, wherein each of the at least one housing inlet passage and each of the at least one housing outlet passage are all disposed on the same side of the housing.

10. The heat sink assembly portion according to claim 1, wherein the fluid is air.

11. The heat sink assembly portion according to claim 1, wherein the fluid is water.

12. A heat sink assembly for cooling a device using circulating fluid, the heat sink assembly comprising;
   a housing including at least one housing inlet passage and at least one housing outlet passage;
   a first cavity disposed in the housing, the first cavity including a first cavity top surface and including a first cavity bottom surface opposed to the first cavity ton surface, the first cavity further including a first cavity outlet side adjacent a first cavity inlet and a first cavity outlet side adjacent a first cavity outlet, the first cavity inlet in fluid communication with the at least one housing inlet passage;
   a plurality of first cavity column members disposed in the first cavity the first cavity column members connected to and extending from the first cavity bottom surface to proximate the first cavity top surface, the first cavity column members arranged in a plurality of rows such that first cavity column members in a row are staggered with respect to first cavity column members in an adjacent row;
   a second cavity disposed in the housing, the second cavity including a second cavity top surface and including a second cavity bottom surface opposed to the second cavity top surface, the second cavity further including a second cavity inlet side adjacent to a second cavity inlet, and a second cavity outlet side adjacent to a second cavity outlet, the first cavity outlet in fluid communication with the second cavity inlet through an interim connecting fluid path, and the second cavity outlet in fluid communication with the at least one housing outlet passage; and
   a plurality of second cavity column members disposed in the second cavity, the second cavity column members connected to and extending from the second cavity bottom surface to proximate the second cavity top surface the second cavity column members arranged in a plurality of rows such that second cavity column members in a row are staggered with respect to second cavity column members in an adjacent row;
   wherein the housing includes:
      a housing inlet portion that includes the at least one housing inlet passage, and wherein the first cavity and the plurality of first cavity column members each being disposed in the housing inlet portion; and
      a housing outlet portion that includes the at least one housing outlet passage, and wherein the second cavity and the plurality of second cavity column members each being disposed in the housing outlet portion; and
   wherein the housing inlet portion and the housing outlet portion are matingly engageable.

13. The heat sink assembly according to claim 12, wherein the at least one housing inlet passage includes two housing inlet passages.

14. The heat sink assembly according to claim 12, wherein the at least one housing outlet passage includes two housing outlet passages.

15. The heat sink assembly according to claim 12, wherein
   the housing inlet portion including a groove extending around at least a portion of an upper surface of the housing inlet portion; and
   the housing outlet portion including a lower surface forming a plateau having a periphery with a peripheral edge defining the periphery, the peripheral edge of the plateau matingly engageable with the groove of the housing inlet portion.

16. The heat sink assembly portion according to claim 15, the groove of the housing inlet portion extending along three of four sides of the housing inlet portion, and an elongated aperture disposed along a fourth side of the housing inlet portion, the elongated aperture forming a part of the interim connecting fluid passage.

17. The heat sink assembly according to claims 12, wherein the interim connecting fluid path includes:
   a third cavity disposed in the housing inlet portion, the third cavity including a third cavity top surface and including a third cavity bottom surface opposed to the third cavity top surface, the third cavity further including a third cavity Inlet side adjacent to a third cavity inlet and a third cavity outlet side adjacent to a third cavity outlet, the third cavity inlet in fluid communication with the first cavity outlet, and the third cavity outlet in fluid communication with the second cavity inlet through a portion of the interim connecting fluid path; and
   a plurality of third cavity column members disposed in the third cavity, the third cavity column members connected to arid extending from the third cavity bottom surface to proximate the third cavity top surface, the third cavity column members arranged in a plurality of rows such that third cavity column members in a row are staggered with respect to third cavity column members in an adjacent row.

18. The heat sink assembly portion according to claim 17, including a first separation wall having opposing sides, the opposing sides of the first separation wall defining the first cavity top surface and the third cavity bottom surface, respectively.

19. The heat sink assembly portion according to claim 18, wherein the first separation wall ii integrally formed with the housing inlet portion.

20. The heat sink assembly according to claim 19, wherein the interim connecting fluid path further includes a fourth cavity disposed in the housing inlet portion, the fourth cavity including a fourth cavity top surface and including a fourth cavity bottom surface opposed to the fourth cavity top surface, the fourth cavity further including a fourth cavity inlet side adjacent to a fourth cavity inlet and a fourth cavity outlet side adjacent to a fourth cavity outlet, the fourth cavity inlet in fluid communication with the third cavity outlet, and the fourth cavity outlet in fluid communication with the second cavity inlet through a portion of the interim connecting fluid path; and
   a plurality of fourth cavity column members disposed in the fourth cavity, the fourth cavity column members connected to and extending from the fourth cavity bottom surface to proximate the fourth cavity top surface, the fourth cavity column members arranged in a plurality of rows such that fourth cavity column members in a row are staggered with respect to fourth cavity column members in an adjacent row.

21. The heat sink assembly portion according to claim 20, including a second separation wail having opposing sides, the opposing sides of the second separation wail defining the third cavity top surface and the fourth cavity bottom surface, respectively.

22. The heat sink assembly portion according to claim 21, wherein the first separation wall being integrally formed with the housing inlet portion.

23. The heat sink assembly according to claim 20, wherein the first cavity column members are aligned with the second cavity column members.

24. The heat sink assembly according to claim 20, wherein
the first cavity column members are aligned with the third cavity column members; and the third cavity column members are aligned with the fourth cavity column members.

25. The heat sink assembly according to claim 24, wherein the first cavity column members are aligned with the second cavity column members.

26. The heat sink assembly portion according to claim 20, wherein:
the first cavity outlet is connected to the third cavity inlet by a first elongated aperture extending along die length of each of the first cavity outlet side and the third cavity inlet side; and
the third cavity outlet is connected to the fourth cavity inlet by a second elongated aperture extending along the length of each of the third cavity outlet side and the fourth cavity inlet side.

27. The heat sink assembly portion according to claim 26, wherein the first elongated aperture and the second elongated aperture are each formed in part by the housing Inlet portion.

28. The heat sink assembly portion according to claim 27, wherein the second elongated aperture is disposed above and proximate to the first cavity inlet.

29. The heat sink assembly portion according to claim 26, wherein the fourth cavity outlet is connected to a third elongated aperture extending along the length of the fourth cavity outlet side.

30. The heat sink assembly portion according to claim 29, wherein the third elongated aperture is disposed above and proximate to the first elongated aperture.

31. A heat sink assembly for cooling a device using circulating fluid, the heat sink assembly comprising;
a housing including at least one housing inlet passage and at least one housing outlet passage;
a first cavity disposed in the housing the first cavity including a first cavity top surface and including a first cavity bottom surface opposed to the first cavity top surface, the first cavity further including a first cavity inlet side adjacent a first cavity inlet and a first cavity outlet side adjacent a first cavity outlet, the first cavity inlet in fluid communication with the at least one housing inlet passage;
a plurality of first cavity column members disposed in the first cavity, the first cavity column members connected to and extending from the first cavity bottom surface to proximate the first cavity top surface the first cavity column members arranged in a plurality of rows such that first cavity column members in a row are staggered with respect to first cavity column members in an adjacent row;
a second cavity disposed in the housing, the second cavity including a second cavity top surface and including a second cavity bottom surface opposed to the second cavity top surface, the second cavity further including a second cavity inlet side adjacent to a second cavity inlet and a second cavity outlet side adjacent to a second cavity outlet, the first cavity outlet in fluid communication with the second cavity inlet through an interim connecting fluid path, and the second cavity outlet in fluid communication with the at least one housing outlet passage; and
a plurality of second cavity column members disposed in the second cavity, the second cavity column members connected to and extending from the second cavity bottom surface to proximate the second cavity top surface, the second cavity column members arranged in a plurality of rows such that second cavity column members in a row are staggered with respect to second cavity column members in an adjacent row; and
wherein each or the first cavity column members extend along a z-dimension from the first cavity bottom surface toward the first cavity top surface and possess a cross-sectional area disposed in an x-y plane, each of the first cavity column members possessing an x-dimension and each the first cavity column members possessing a y-dimension.

32. The heat sink assembly according to claim 31, wherein the cross-sectional area of each of the first cavity column members defines a circle in the x-y plane.

33. The heat sink assembly according to claim 31, wherein the cross-sectional area of each of the first cavity column members defines an elliptical in the x-y plane.

34. The heat sink assembly according to claim 31, wherein a z-dimension of each of the first cavity column members is smaller than either the x-dimension or the y-dimension of the first cavity column members.

35. The heat sink assembly according to claim 31, wherein each of the second cavity column members extend along a z-dimension from the second cavity bottom surface toward the second cavity top surface and possess a cross-sectional area disposed in an x-y plane, an i-dimension of each of the second cavity column members being substantially equal to a y-dimension of each the second cavity column members, respectively.

36. A heat sink assembly for cooling a device using circulating fluid, the heat sink assembly comprising:
a housing including at least one housing inlet passage and as least one housing outlet passage;
a first cavity disposed in the housing, the first cavity including a first cavity top surface and including a first cavity bottom surface opposed to the first cavity cop surface, the first cavity further including a first cavity inlet side adjacent a first cavity inlet and a first cavity outlet side adjacent a first cavity outlet, the first cavity inlet in fluid communication with the at least one housing inlet passage;
a plurality of first cavity column members disposed in the first cavity, the first cavity column members connected to and extending from the first cavity bottom surface to proximate the first cavity cop surface, the first cavity column members arranged in a plurality of rows such that first cavity column members in a row are staggered with respect to first cavity column members in an adjacent row, the first cavity column members being connected to the first cavity top surface;
a second cavity disposed in the housing, the second cavity including a second cavity top surface and including a second cavity bottom surface opposed to the second cavity top surface, the second cavity further including a second cavity inlet side adjacent to a second cavity inlet and a second cavity outlet side adjacent to a second cavity outlet, the first cavity outlet in fluid communication with the second cavity inlet through an interim connecting fluid path, and the second cavity outlet in fluid communication with the at least one housing outlet passage; and
a plurality of second cavity column members disposed in the second cavity, the second cavity column members connected to and extending from the second cavity bottom surface to proximate the second cavity top surface, the second cavity column members arranged in a plurality of rows such that second cavity column members in a row are staggered with respect to second cavity column members in an adjacent row, the second cavity column members connected to the second cavity top surface;

wherein the housing includes:
a housing inlet portion that includes the at least one housing inlet passage, and wherein the first cavity and the plurality of first cavity column members each being disposed in the housing inlet portion; and a housing outlet portion that includes the at least one housing outlet passage, and wherein the second cavity and the plurality of second cavity column members each being disposed in the housing outlet portion; and wherein the housing inlet portion and the housing outlet portion are matingly engageable, the housing inlet portion including a groove extending around at least a portion of an upper surface of the housing inlet portion;

the housing outlet portion including a lower surface forming a plateau having a periphery with a peripheral edge defining the periphery, the peripheral edge of the plateau matingly engageable with the groove of the housing inlet portion; and an inlet conduit connected to the inlet passage of the housing; and an outlet conduit connected to the outlet passage of the housing;

wherein the first cavity inlet side directly opposes the first cavity outlet side such that fluid passing from the flint cavity inlet to the first cavity outlet passes by the first cavity column members, and the first cavity inlet disperses the flow of fluid along a length of the first cavity inlet side, and the first cavity outlet provides for outlet of the flow of fluid along a length of the first cavity outlet side; and the heat sink assembly further includes an electrical component that is cooled, the housing engaged with the electrical component.

* * * * *